(12) United States Patent
Kim (10) Patent No.: US 9,437,751 B2
(45) Date of Patent: Sep. 6, 2016

(54) NON-VOLATILE MEMORY DEVICE INCLUDING CHARGE TRAPPING LAYER AND METHOD FOR FABRICATING THE SAME

(71) Applicant: SK INNOVATION CO., LTD., Seoul (KR)

(72) Inventor: Jun-Hyung Kim, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 0 days.

(21) Appl. No.: 14/555,040

(22) Filed: Nov. 26, 2014

(65) Prior Publication Data

US 2015/0179819 A1    Jun. 25, 2015

(30) Foreign Application Priority Data

Dec. 19, 2013  (KR) .................. 10-2013-0159747

(51) Int. Cl.

| | |
|---|---|
| H01L 21/336 | (2006.01) |
| H01L 29/792 | (2006.01) |
| H01L 21/28 | (2006.01) |
| H01L 29/423 | (2006.01) |
| H01L 21/02 | (2006.01) |
| H01L 29/51 | (2006.01) |
| H01L 29/66 | (2006.01) |

(52) U.S. Cl.
CPC ......... *H01L 29/792* (2013.01); *H01L 21/0228* (2013.01); *H01L 21/02118* (2013.01); *H01L 21/28273* (2013.01); *H01L 21/28282* (2013.01); *H01L 29/42324* (2013.01); *H01L 29/42348* (2013.01); *H01L 29/51* (2013.01); *H01L 29/518* (2013.01); *H01L 29/66825* (2013.01); *H01L 29/66833* (2013.01)

(58) Field of Classification Search
CPC .................. H01L 21/28273; H01L 29/7883; H01L 29/66825; H01L 29/42332; H01L 29/4966
USPC ........................ 438/263, 264, 594
See application file for complete search history.

(56) References Cited

U.S. PATENT DOCUMENTS

| | | | |
|---|---|---|---|
| 7,220,482 B2 * | 5/2007 | Mino ..................... | B05D 1/185 257/E29.129 |
| 2006/0099430 A1 | 5/2006 | Subramanya et al. | |
| 2010/0193762 A1 * | 8/2010 | Hsieh .................... | H01L 45/085 257/4 |
| 2010/0240208 A1 | 9/2010 | Lee et al. | |
| 2012/0130053 A1 | 5/2012 | Lee et al. | |
| 2013/0327392 A1 | 12/2013 | Weitekamp et al. | |

FOREIGN PATENT DOCUMENTS

| | | |
|---|---|---|
| JP | 2003-168606 | 6/2013 |
| WO | WO 2008/068873 | 6/2008 |

OTHER PUBLICATIONS

Brust, M., et al., Some recent advances in nanostructure preparation from gold and silver particles: a short topical review, Colloids and Surfaces A: Physicochemical and Engineering Aspects, 2002, pp. 175-186, vol. 202.

The extended European search report issued by the European Patent Office on Sep. 30, 2015.

* cited by examiner

*Primary Examiner* — Hung Vu
(74) *Attorney, Agent, or Firm* — I P & T Group LLP (57) ABSTRACT

A non-volatile memory device includes a charge trapping layer for trapping charges. The charge trapping layer includes a linker layer formed over a substrate and including linkers to be bonded to metal ions metallic nanoparticles formed out of the metal ions over the linker layer and a nitride filling gaps between the metallic nanoparticles.

19 Claims, 5 Drawing Sheets

NON-VOLATILE MEMORY DEVICE INCLUDING CHARGE TRAPPING LAYER AND METHOD FOR FABRICATING THE SAME

CROSS-REFERENCE TO RELATED APPLICATIONS

The present application claims priority of Korean Patent Application No. 10-2013-0159747, filed on Dec. 19, 2013, which is incorporated herein by reference in its entirety.

BACKGROUND

1. Field

Various embodiments relate to a non-volatile memory device including a charge trapping layer and a method for fabricating the non-volatile memory device.

2. Description of the Related Art

Non-volatile semiconductor memory devices retain stored data even when their power supply is cut off. This is in contrast to volatile memory devices, which are unable to store data after power is cut off.

Non-volatile memory devices include memory cells, the basic units for storing data, which are arranged in columns and rows. Non-volatile memory devices may be organized depending on the type of memory cells they have.

One example of a non-volatile memory device is a floating gate-type NAND flash memory device (simply referred to as a flash memory device, hereafter), which has come into common use. Flash memory devices have a memory cell structure which includes a silicon oxide layer over a substrate, a floating gate silicon layer where charges are stored, a barrier oxide layer that serves as a barrier to prevent charge loss from the floating gate, and a control gate. The silicon oxide layer, the silicon layer, the barrier oxide layer, and the control gates are sequentially stacked, in that order.

The semiconductor industry continues to shrink flash memory cells to increase memory capacity as consumers continue to demand more and more data storage. Reducing cell size requires decreasing the height of floating gates, a part of the stacked structure.

Following the trend of more data storage, memory devices with a SONOS (Silicon-Oxide-Nitride-Oxide-Silicon) structure are being researched and developed. SONOS structure memory devices use a silicon nitride (e.g., $Si_3N_4$) layer as charge storage layer, instead of the traditional floating gate, and may retain data as well as effectively decrease memory cell height. Additionally, there is a modified SONOS structure, called a MONOS (Metal-Oxide-Nitride-Oxide-Silicon) structure. The charge storage structure and operating principles of the MONOS structure are the same as that of the SONOS structure, except that metal is used for the control gates, instead of silicon. The structure of the charge storage area is then silicon-oxide, silicon-nitride, silicon-oxide (Oxide-Nitride-Oxide: ONO). However, the function of the charge storage area remains the same.

A non-volatile memory device adopting the ONO structure uses a silicon nitride (e.g., $Si_3N_4$) for trapping charges in each unit cell. The principle behind this method is that the threshold voltage "Vth" is changed when charges are trapped in the silicon nitride.

Charge-trapping non-volatile memory devices do have a drawback in that data retention time is not long enough. This is due to insufficient density and/or insufficient uniformity of charge trapping sites in the silicon nitride (e.g., $Si_3N_4$) layer. To acquire sufficient storage capability, the silicon nitride (e.g., $Si_3N_4$) layer has to retain a certain thickness, which may interfere with the miniaturization process. This may also cause problems because a thick silicon nitride (e.g., $Si_3N_4$) layer may increase the required operating voltages and slow operating speeds. The inventive concept disclosed herein proposes a solution to these design difficulties.

SUMMARY

Various embodiments are directed to a charge-trapping non-volatile memory device including a charge trapping layer that may be scaled down to reduce power consumption while retaining excellent operation stability, reproducibility, and reliability, and a method for fabricating the non-volatile memory device.

In an embodiment, a non-volatile memory device includes: a charge trapping layer for trapping charges, wherein the charge trapping layer includes: a linker layer formed over a substrate and including linkers suitable for bonding to metal ions; metallic nanoparticles formed out of the metal ions over the linker layer; and a nitride filling gaps between the metallic nanoparticles.

The non-volatile memory device may further include: a first oxide interposed between the substrate and the charge trapping layer; a second oxide formed over the charge trapping layer; and a gate formed over the second oxide.

The linkers may be organic molecules bonded to a surface of the substrate.

The charge trapping layer may further include an organic surfactant of one or more kinds bonded to the metal ions or the metallic nanoparticles.

The organic surfactant may be a nitrogen-containing organic material or a sulfur-containing organic material.

The organic surfactant may include a first organic material and a second organic material of different kinds, and the first organic material may be a nitrogen-containing organic material or a sulfur-containing organic material, and the second organic material may be a phase-transfer catalyst-based organic material.

The metallic nanoparticles may have an average particle diameter of about 0.5 to 3.0 nm.

The metallic nanoparticles may have a particle radius standard deviation of about ±20% or less.

The linker layer may be a self-assembled monomolecular layer of organic molecules formed over the substrate.

The linkers may be a silane compound layer having at least one functional group selected from an amine group (—$NH_2$), a carboxyl group (—COOH), and a thiol group (—SH).

Each of the linkers may include: a first functional group bonded to the surface of the substrate; a second functional group bonded to the metal ions; and a chain group for coupling the first functional group and the second functional group.

The metallic nanoparticles may be selected from metal nanoparticles, metal oxide nanoparticles, metal nitride nanoparticles, metal carbide nanoparticles, and intermetallic compound nanoparticles.

The metallic nanoparticles may be arranged separately to form a single layer that is one metallic nanoparticle in thickness. The charge trapping layer may have a vertical multi-stack structure in which a linker layer and a nanoparticle layer are alternately and repeatedly stacked.

In another embodiment, a non-volatile memory device includes: a charge trapping layer suitable for trapping charges, wherein the charge trapping layer includes: dielectric particle supporters formed over a substrate; a linker layer including linkers that are suitable for bonding to metal ions, wherein the linker layer is formed over the dielectric particle supporters; and metallic nanoparticles formed out of the metal ions.

The non-volatile memory device may further include: a first oxide interposed between the substrate and the charge trapping layer; a second oxide formed over the charge trapping layer; and a gate formed over the second oxide.

The dielectric particle supporters where the linkers are bonded may form single supporter layer (one dielectric particle thick) or multiple supporter layers (multiple dielectric particles thick).

Each of the linkers may include a functional group selected from an amine group (—$NH_2$), a carboxyl group (—COOH), and a thiol group (—SH), suitable for bonding to a metal ion.

The charge trapping layer may further include an organic surfactant of one or more kinds bonded to the metal ions or the metallic nanoparticles.

The organic surfactant may be a nitrogen-containing organic material or a sulfur-containing organic material.

The organic surfactant may include a first organic material and a second organic material of different kinds, and the first organic material may be a nitrogen-containing organic material or a sulfur-containing organic material, and the second organic material may be a phase-transfer catalyst-based organic material.

The metallic nanoparticles may have an average particle diameter of about 0.5 to 3.0 nm.

The metallic nanoparticles may have a particle radius standard deviation of about ±20% or less.

The metallic nanoparticles may be selected from metal nanoparticles, metal oxide nanoparticles, metal nitride nanoparticles, metal carbide nanoparticles, and intermetallic compound nanoparticles.

In another embodiment, a method for fabricating a non-volatile memory device includes: forming a tunneling layer over a substrate; and forming a charge trapping layer over the tunneling layer, wherein the forming of the charge trapping layer includes: forming a linker layer including linkers over the tunneling layer; forming metal ions over the linker layer; forming metallic nanoparticles out of the metal ions; and forming a nitride over a structure including the metallic nanoparticles.

The metallic nanoparticles may be formed through reduction and growth of the metal ions.

The forming of the metallic nanoparticles may include applying energy to the metal ions.

The method may further include supplying an organic surfactant of one or more kinds, before or while the energy is applied.

The method may further include removing the organic surfactant that remains on surface of the metallic nanoparticles, before the forming of the nitride.

The linker layer may be formed by applying a linker solution to a surface of the substrate.

The linker layer may be formed through an Atomic Layer Deposition (ALD) process using a gas containing the linkers.

The linkers may include a functional group selected from an amine group (—$NH_2$), a carboxyl group (—COOH), and a thiol group (—SH).

The forming of the metal ions may include having a metal precursor make contact with a structure where the linkers are bonded (or simply, come into contact or bond with the linkers).

The forming of the metal ions may include applying a metal precursor solution where a metal precursor is dissolved to the structure where the linkers are bonded, or supplying a gas-phase metal precursor to the structure where the linkers are bonded.

The energy may be at least one selected from heat energy, chemical energy, light energy, vibration energy, ion beam energy, electron beam energy, and radiation energy.

In another embodiment, a method for fabricating a non-volatile memory device includes: forming a tunneling layer over a substrate; and forming a charge trapping layer over the tunneling layer, wherein the forming of the charge trapping layer includes: forming dielectric particle supporters over the tunneling layer; forming a linker lay, including linkers, over the dielectric particle supporters; bonding metal ions to the linkers; forming metallic nanoparticles out of the metal ions; and forming a nitride over a structure including the metallic nanoparticles.

The forming of the dielectric particle supporters including linkers attached thereto may include preparing a supporter material by mixing dielectric material particles and linkers in a solution and coating the substrate with the supporter material or depositing the supporter material on the substrate.

The metallic nanoparticles may be formed through reduction and growth (or agglomeration) of the metal ions.

The forming of the metallic nanoparticles may include applying energy to the metal ions.

The method may further include supplying an organic surfactant of one or more kinds, before or while the energy is applied.

The method may further include removing the organic surfactant that remains on surface of the metallic nanoparticles, before the forming of the nitride.

Each of the linkers may include a functional group selected from an amine group (—$NH_2$), a carboxyl group (—COOH), and a thiol group (—SH) suitable for bonding to the metal ions.

The forming of the metal ions may include having a metal precursor make contact with a structure where the linkers are bonded.

The forming of the metal ions may include applying a metal precursor solution where a metal precursor is dissolved to the structure where the linkers are bonded, or supplying a gas-phase metal precursor to the structure where the linkers are bonded.

The energy may be at least one selected from heat energy, chemical energy, light energy, vibration energy, ion beam energy, electron beam energy, and radiation energy.

DETAILED DESCRIPTION

A non-volatile memory device including a charge trapping layer and a method for fabricating the same, according to embodiments of the present disclosure, will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. The drawings are not necessarily to scale and, in some instances, proportions may have been exaggerated in order to clearly illustrate features of the embodiments. Throughout the disclosure, reference numerals correspond directly to the like numbered parts in the various figures and embodiments of the present invention.

It should be readily understood that the meaning of "on" and "over" in the present disclosure should be interpreted in the broadest manner such that "on" means not only "directly on" but also "on" something with intermediate feature(s) or layer(s) therebetween, and that "over" means not only directly over but also over something with an intermediate feature(s) or layer(s) therebetween. It is also noted that in this specification, "connected/coupled" refers to one component not only directly coupling another component but also indirectly coupling another component through an intermediate component. In addition, a singular form may include a plural form, and vice versa, as long as it is not specifically mentioned.

Unless otherwise mentioned, all terms used herein, including technical and scientific terms, have the same meaning as understood by those skilled in the technical field to which the present disclosure pertains. Detailed descriptions of known functions and configurations will be omitted when it may obscure the subject matter of the present disclosure. Also, all "embodiments" discussed refer to embodiments of the inventive concept disclosed in this application.

Figure 1:
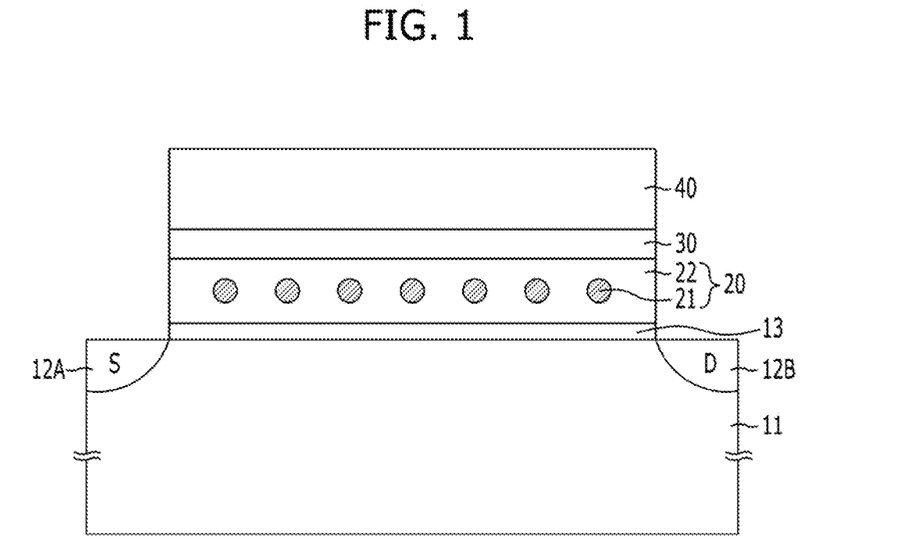
FIG. 1 is a cross-sectional view illustrating a portion of a charge trapping non-volatile memory cell in accordance with an embodiment of the present disclosure.

FIG. 1 is a cross-sectional view illustrating a portion of a charge trapping non-volatile memory cell in accordance with an embodiment.

Referring to FIG. 1, a first oxide 13 may be formed over a silicon substrate 11. The first oxide 13 functions as a tunneling layer. A charge trapping layer 20 may be formed over the first oxide 13. The charge trapping layer 20 includes nanoparticles 21, and the nanoparticles 21 may form a single layer (one nanoparticle thick) or a multiple layers (multiple nanoparticles thick). The charge trapping layer 20 may include a nitride 22 surrounding the nanoparticles 21. The nitride 22 may be $Si_3N_4$. A second oxide 30 may be formed over the charge trapping layer 20 and a gate 40 may be formed over the second oxide 30. The second oxide 30 may function as a gate dielectric material.

The first oxide 13, the charge trapping layer 20, the second oxide 30, and the gate 40 may be patterned over the substrate 11 to form one gate stack. A source 12A and a drain 128 may be formed in the substrate 11 on the sides of the gate stack.

The embodiments are not limited to the simple stack structure shown in FIG. 1. The present invention may be applied to various types of memory cells including memory cells having three-dimensional structures. This means the position and shape of the charge trapping layer as well as the other elements may be different. To be specific, the charge trapping layer 20 may have a vertical shape of a pillar and gates may be disposed on the sides of the charge trapping layer 20.

As described above, the non-volatile memory device in accordance with the embodiments includes an improved charge trapping layer 20. The improved charge trapping layer 20 has very fine, uniformly sized, high-density nanoparticles 21. Hereafter, the features and structures of the improved charge trapping layer and a method for fabricating the same will be described in detail.

[Improved Charge Trapping Layer and Method for Fabricating the Same in Accordance with a First Embodiment of the Present Invention]

FIGS. 2A to 2E are cross-sectional views illustrating a method for fabricating a charge trapping layer in accordance with a first embodiment.

Figure 2A:
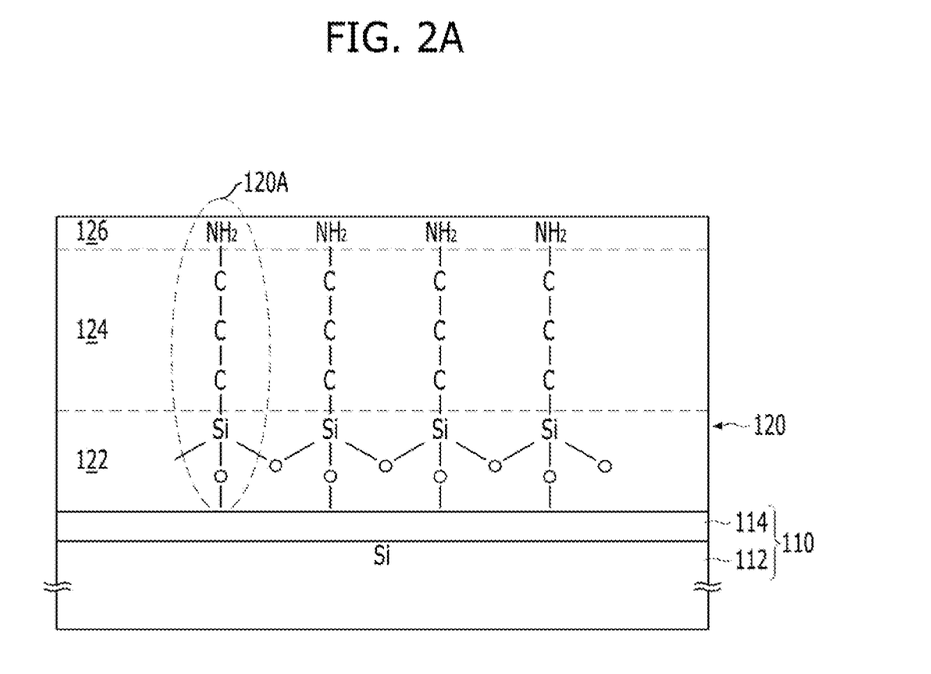
FIGS. 2A to 2E are cross-sectional views illustrating a method for forming a charge trapping layer in accordance with a first embodiment of the present disclosure.
Figure 2B:
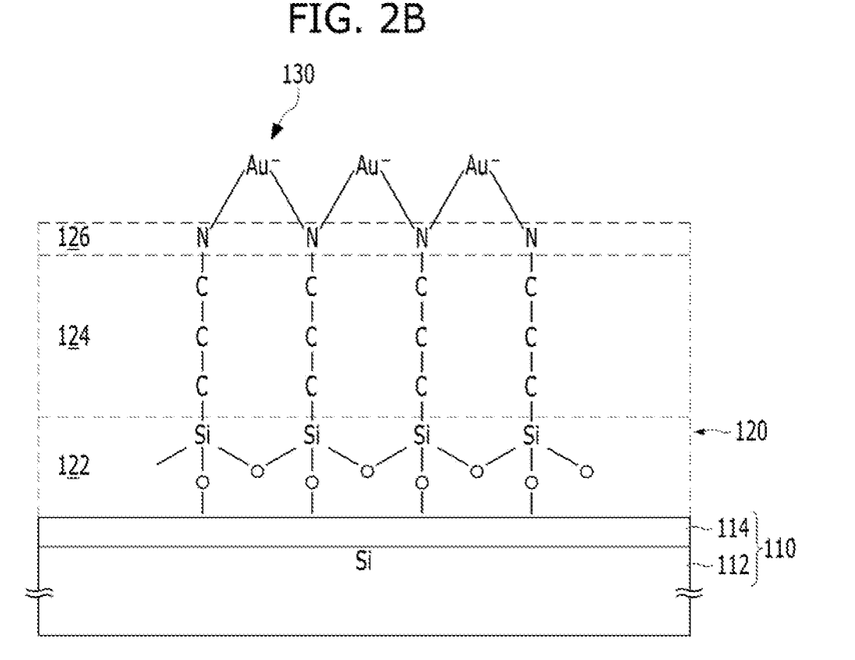
Figure 2C:
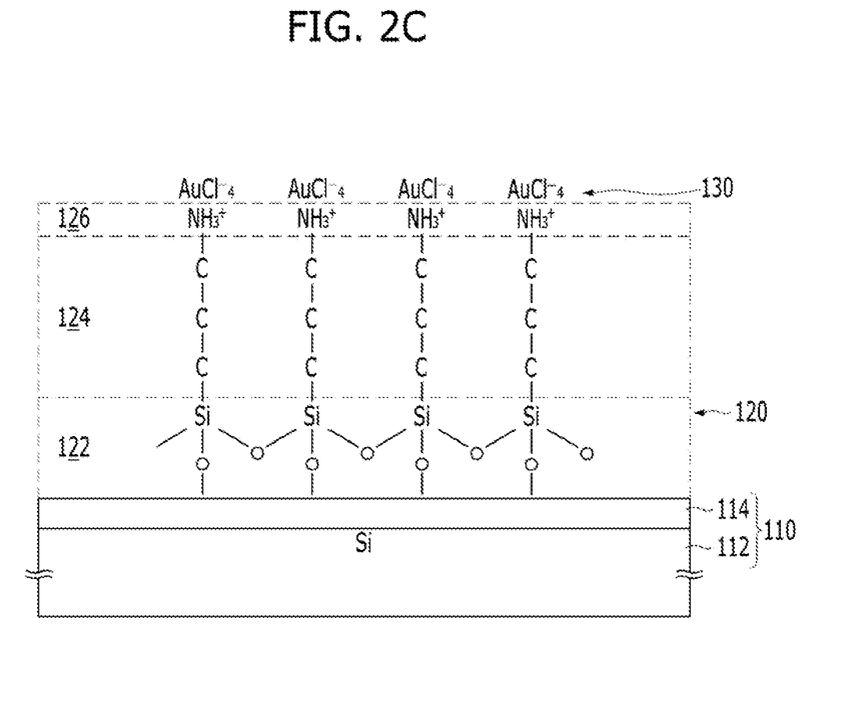
Figure 2D:
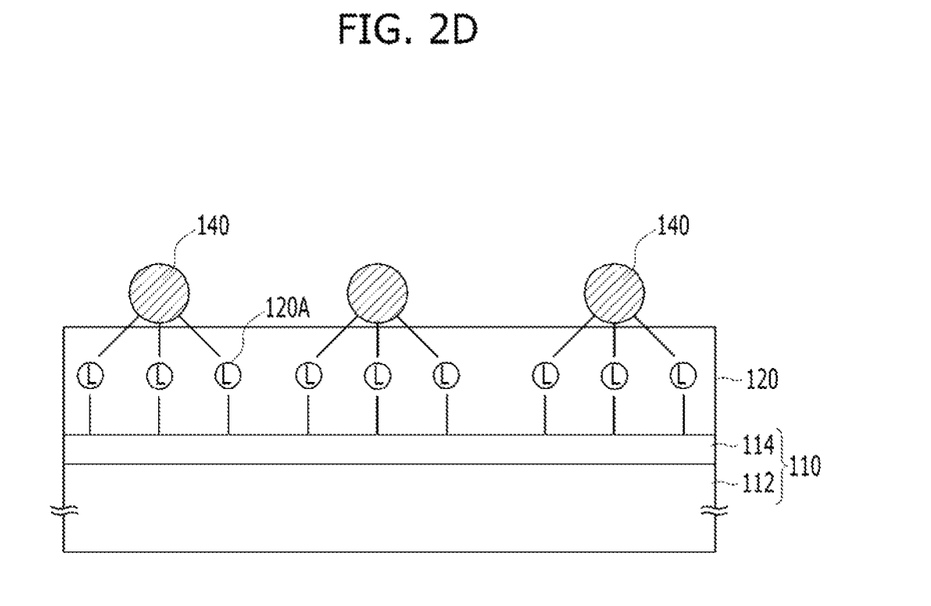

In accordance with the first embodiment, a method for fabricating a charge trapping layer may include bonding linkers 120A to a substrate 110 (see FIG. 2A); bonding metal ions 130 to the linkers 120A (see FIGS. 2B and 2C); and transforming the metal ions 130 into metallic nanoparticles 140 by applying energy (see FIG. 2D). The method for fabricating the charge trapping layer may further include supplying a nitride 150 to the structure including the metallic nanoparticles (see FIG. 2E). Also, the method may include supplying one or more organic surfactants before the energy is applied or while applying the energy.

FIG. 2A shows linkers 120A bonded to the prepared substrate 110. Referring to FIG. 2A, the substrate 110 may have a surface layer 114 having functional groups capable of bonding to the linkers. For example, the substrate 110 may be a silicon substrate 112 having a silicon oxide ($SiO_2$) layer as the surface layer 114.

The substrate 110 may be a semiconductor substrate. The substrate 110 may serve as a physical support to the constituent elements of the memory device, or the substrate 110 may include an additional supporting substrate. Furthermore, the semiconductor substrate may be used as a raw material for forming constituent elements of the memory device including a channel. Non-limiting examples of preparing the semiconductor substrate include forming a passivation layer through oxidation and/or nitridation of the semiconductor substrate, forming a source or a drain by doping the semiconductor substrate with impurities, alloying the semiconductor substrate (e.g., silicidation), and forming of a channel.

The semiconductor substrate may be a wafer, film, or a thin film whose surface is nano-patterned (or structured) to suit the specified physical design. This may include adding a recess structure or a three-dimensional transistor structure.

The substrate 110 may be a rigid substrate or a flexible substrate. Non-limiting examples of the flexible substrate include a flexible polymer substrate formed of polyethylene terephthalate (PET), polyethylene naphthalate (PEN), polyimide (PI), polycarbonate (PC), polypropylene (PP), triacetyl cellulose (TAC), polyethersulfone (PES), polydimethylsiloxane (PDMS), or a mixture thereof. When a flexible substrate 110 is used, the surface layer 114 of the substrate may be made of an organic material having functional groups (e.g., —OH functional group) suitable for bonding to the linkers.

The substrate may include a transparent substrate. Non-limiting examples of the transparent substrate include glass substrates and transparent plastic substrates.

The substrate may be an organic semiconductor, an inorganic semiconductor, or a stacked structure thereof.

Non-limiting examples of inorganic semiconductor substrates include materials selected from group 4 semiconductors, which include silicon (Si), germanium (Ge) and silicon germanium (SiGe); group 3-5 semiconductors, which include gallium arsenide (GaAs), indium phosphide (InP) and gallium phosphide (GaP); group 2-6 semiconductors, which include cadmium sulfide (CdS) and zinc telluride (ZnTe); group 4-6 semiconductors, which include lead sulfide (PbS); and a stack of two or more layers of listed materials.

The inorganic semiconductor substrate may be a monocrystalline material, a polycrystalline material, an amorphous material, or a mixture of a crystalline material and an amorphous material. When the inorganic semiconductor substrate is a stacked structure, where two or more layers are stacked, each layer may be a monocrystalline material, a polycrystalline material, an amorphous material, or a mixture of a crystalline material and an amorphous material.

To be specific, the inorganic semiconductor substrate may be a semiconductor substrate including a wafer, such as a silicon (Si) substrate 112, a semiconductor substrate including a wafer where a semiconductor oxide layer is stacked, such as a silicon substrate with a surface oxide layer, or a Silicon On Insulator (SOI) substrate, and a silicon (Si) semiconductor substrate including a metal thin film and a surface oxide layer.

The inorganic semiconductor substrate may be planar with flat active regions or structured substrate with protruding pin-like active regions. The active region where the device is formed may have isolations such as trenches, field oxide (FOX), and/or Local. Oxidation of Silicon (LOCOS), and it may have more than one active region. The active region, defined by typical isolations, may include a channel region and a source and drain region that confront each other with the channel region in-between.

When using an organic semiconductor substrate, it may be an n-type organic semiconductor or a p-type organic semiconductor. Non-limiting examples of organic semiconductors include fulleren-derivatives, such as copper-phthalocyanine (CuPc), poly(3-hexythiophene) (P3HT), pentacene, subphthalocyanines (SubPc), fulleren (C60), [6,6]-phenyl-C61-butyric acid methyl ester (PCBM) and [6,6]-phenyl-C70-butyric acid methyl ester (PC70BM), and tetra uorotetracyanoquinodimethane (F4-TCNQ). However, the organic semiconductor materials do not restrict the spirit and concept of the present disclosure.

The channel region of the organic semiconductor substrate may be an organic semiconductor layer, and a source and a drain may be formed to confront each other at both ends of the organic semiconductor substrate. The semiconductor substrate may include a supporting substrate disposed in the lower portion of the semiconductor substrate to support the organic semiconductor layer, the source and the drain. The supporting substrate may be a rigid substrate or a flexible substrate.

The semiconductor substrate may be a planar substrate that provides a channel of a flat plane, a structured substrate that provides a channel of more than two planes, or a structured substrate having a protruded pin-shaped channel region.

The source and the drain may form an electric field in a direction parallel to the channel, and the length of the channel may be decided based on the distance between the source and the drain that confront each other. The distance may be modified according to the design of the memory device. According to an embodiment, the distance between the source and the drain may range from about 5 to 200 nm.

The surface layer 114 of the substrate 110 may be formed of any material with functional groups suitable for bonding to the linkers. For example, the surface layer 114 may be a single layer or a stacked layer, where two or more layers of different materials are stacked. If the surface layer 114 is a stacked layer, the dielectric constant of each layer may be different.

To be specific, the surface layer 114 of the substrate 110 may be a single layer of a material selected from an oxide, a nitride, an oxynitride, and a silicate, or a stacked layer where two or more layers, each of which is formed of a listed material, are stacked. Non-limiting examples of the surface layer 114 of the substrate 110 include a single layer of at least one material selected from among a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, a hafnium silicate, a mixture thereof, and a composite thereof, or a stacked layer where two or more layers, each of which is formed of a listed material, are stacked.

The surface layer 114 of the substrate 110 may also include an oxide of at least one element selected from metals, transition metals, post-transition metals, and metalloids. Examples of the metals include Li, Na, K, Rb, Cs, Be, Mg, Ca, Sr, and Ba. Examples of the transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, and Au. Examples of the post-transition metals include Al, Ga, In, Sn, Tl, Pb, and Bi. Examples of the metalloids include B, Si, Ge, As, Sb, Te, and Po.

When the surface layer 114 functions as a tunneling layer, the surface layer 114 may have a thickness of about 0.1 to 20 nm based on Equivalent Oxide Thickness (EOT). According to another embodiment, the surface layer 114 may have a thickness of about 0.8 to 5 nm based on Equivalent Oxide Thickness (EOT). However, the spirit and concept of the present invention are not limited to these measurements.

The surface layer 114 may be formed through a thermal oxidation process, a physical deposition process, or a chemical deposition process. Non-limiting examples of the physical deposition process and the chemical deposition process include sputtering, magnetron-sputtering, e-beam evaporation, thermal evaporation, Laser Molecular Beam Epitaxy (L-MBE), a Pulsed Laser Deposition (PLD), vacuum deposition, Atomic Layer Deposition (ALD), and Plasma Enhanced Chemical Vapor Deposition (PECVD).

A linker layer 120 may be formed on the substrate 110. The linker layer 120 may be composed of linkers 120A. The linker layer 120 may be a self-assembled monomolecular layer bonded to the surface of the substrate 110.

The linkers 120A may be organic molecules that are chemically bonded to or adsorbed on the surface of the substrate 110 and may chemically bond with metal ions 130. Specifically, the linkers 120A may be organic linkers having both functional groups 122 that are chemically bonded to or adsorbed on the surface layer 114 of the substrate and functional groups 126 that are chemically bonded to metal ions (to be formed later). The chemical bond may include a covalent bond, an ionic bond, or a coordination bond. For example, the bond between metal ions 130 and the linkers 120A may be an ionic bond between positively charged (or negatively charged) metal ions 130 and linkers that are negatively charged (or positively charged), at least at one end. For example, the bond between the surface layer 114 of the substrate 110 and the linkers 120A may be a bond caused by self-assembly or may be a spontaneous chemical bond between the functional groups 122 of the linkers and the surface of the substrate.

More specifically, the linkers 120A may be organic molecules that form a self-assembled monomolecular layer. In other words, the linkers 120A may be organic molecules having functional groups 122 that are bonded to the surface layer 114 and functional groups 126 bonded with metal, ions 130. The linkers 120A may include chain groups 124, which connect the functional groups 122 with the functional groups 126 and enable the formation of a monomolecular layer aligned by Van Der Waals interactions.

Self-assembly may be achieved by suitably designing the material of the surface of the substrate and the first functional groups 122 of the linkers 120A. A set of end groups for materials that are generally known to be self-assembling may be used.

In a specific non-limiting embodiment, when the surface layer 114 of the substrate 110 is made of oxide, nitride, oxynitride, or silicate, the organic molecule that is the linker may be a compound represented by the following Formula 1.

$$R1-C-R2 \qquad \text{(Formula 1)}$$

In Formula 1, R1 represents a functional group 122 that bonds with the substrate, C represents a chain group 124, and R2 represents a functional group 126 that bonds with metal ions. R1 may be one or more functional groups selected from acetyl, acetic acid, phosphine, phosphonic acid, alcohol, vinyl, amide, phenyl, amine, acryl, silane, cyan and thiol groups. C is a linear or branched carbon chain having 1 to 20 carbon atoms. R2 may be one or more functional groups selected from carboxylic acid, carboxyl, amine, phosphine, phosphonic acid and thiol groups.

In a non-limiting embodiment, the organic molecule that is the linker 120A may be one or more selected from among octyltrichlorosilane (OTS), hezamethyldisilazane (HMDS), octadecyltrichlorosilane (ODTS), (3-aminopropyl) trimethoxysilane (APS), (3-aminopropyl)triethoxysilane, N-(3-aminopropyl)-dimethyl-ethoxysilane (APDMES), perfluorodecyltrichlorosilane (PFS), mercaptopropyltrimethozysilane (MPTMS), N-(2-aminoethyl)-3aminopropyltrymtethoxysilane, (3-trimethoxysilylpropyl) diethylenetriamine, octadecyltrimethoxysilane (OTMS), (heptadecafluoro-1,1,2,2-tetrahydrodecyl)trichlorosilane (FDTS), dichlorodimethylsilane (DDMS), N-(trimethoxysilyipropyl)ethylenediamine triacetic acid, hexadecanethiol (HDT), and epoxyhexyltriethoxysilane.

To ensure stable isolation between the nanoparticles and the substrate, the organic molecule that is the linker may include an alkane chain group 124, particularly an alkane chain group having 3 to 20 carbon atoms, and may further include an oxygen-containing moiety. Examples of the oxygen-containing moiety include ethylene glycol (—O—$CH_2$—$CH_2$—), carboxylic acid (—COOH), alcohol (—OH), ether (—O—), ester (—COO—), ketone (—CO—), aldehyde (—COH) and/or amide (—NH—CO—), etc.

Attachment of the linkers 120A may be performed by bringing the substrate 110 into contact with a solution of linkers 120A in a solvent. The solvent that is used to form the linker solution may be any solvent that may dissolve the linkers and be easily removed by volatilization. As is known in the art, when the linker contains a silane group, water for promoting hydrolysis may be added to the linker solution. The contact between the substrate and the linker solution may be performed using any method that can form a self-assembled monomolecular layer on a substrate. In a non-limiting embodiment, the contact between the linker solution and the substrate may be performed using a dipping, micro contact printing, spin-coating, roll coating, screen coating, spray coating, spin casting, flow coating, screen printing, ink jet coating or drop casting method.

When metal ions 130 are fixed to the substrate by the linkers 120A, there are advantages in that damage to the surface layer 114 of the substrate may be prevented, and a uniformly distributed metal ion layer may be formed by self-assembly. Also, nanoparticles 140 prepared by application of energy may be stably fixed.

The linkers may be functional groups that chemically bond with metal ions. The surface of the substrate 110 may be modified to form a functional group (linker), and then a metal precursor may be supplied to the surface-modified substrate so that metal ions may be bonded to the functional group. The functional group may be one or more selected from carboxylic acid, carboxyl, amine, phosphine, phosphonic acid and thiol groups. Formation of the functional groups on the substrate surface may be performed using any method. Specific examples of the method for forming the functional groups on the substrate surface include plasma modification, chemical modification, and vapor deposition (application) of a compound having a functional group. Modification of the substrate surface may be performed by vapor deposition (application of a compound having a functional group) to prevent surface layer impurity introduction, quality deterioration, and damage.

In a specific non-limiting embodiment, when the surface layer 114 of the substrate 110 is formed of an oxide, a nitride, an oxynitride or a silicate, a functional group (linker) may be formed by a silane compound layer on the substrate 110.

The silane compound layer may be an alkozy silane compound having one or more functional groups selected from among carboxylic acid, carboxyl, amine, phosphine, phosphonic acid and thiol groups.

The silane compound may be represented by the following Formula 2:

$$R^1{}_n(R^2O)_{3-n}Si-R \qquad \text{(Formula 2)}$$

In Formula 2, $R^1$ is hydrogen, a carboxylic acid group, a carboxyl group, an amine group, a phosphine group, a phosphonic acid group, a thiol group, or a linear or branched alkyl group having 1 to 10 carbon atoms; R is a linear or branched alkyl group having 1 to 10 carbon atoms; R is a linear or branched alkyl group having 1 to 10 carbon atoms; the alkyl group in R may be substituted with one or more selected from among carboxylic acid, carboxyl, amine, phosphine, phosphonic acid and thiol groups; the alkyl group in $R^1$ and the alkyl group in $R^2$ may each be independently substituted with one or more selected from among halogen, carboxylic acid, carboxyl, amine, phosphine, phosphonic acid and thiol groups; and n is 0, 1 or 2.

The silane compound may be represented by one of the following Formulas 3 to 5:

$$(R^1)_3Si-R^4-SH \qquad \text{(Formula 3)}$$

$$(R^3)_3Si-R^4-COOH \qquad \text{(Formula 4)}$$

$$(R^3)_3Si-R^4-NH_2 \qquad \text{(Formula 5)}$$

In the Formulas 3, 4, and 5, $R^3$ groups are each independently an alkoxy or alkyl group, and one or more R groups are an alkoxy group; and $R^4$ is a divalent hydrocarbon group having 1 to 20 carbon atoms. $R^3$ groups in Formula 3, 4 or 5 may be the same or different and may each be independently an alkoxy group, such as methoxy, ethoxy or propoxy, or an alkyl group; and $R^4$ may be a divalent hydrocarbon group having 1 to 20 carbon atoms, such as —$CH_2$—, —$CH_2$—$CH_2$—, —$CH_2$—$CH_2$—$CH_2$—, —$CH_2$—$CH(CH_3)$—$CH_2$— or —$CH_2$—$CH_2$—$CH(CH_3)$—.

Non-limiting examples of the carboxysilane compound include methyldiacetoxysilane, 1,3-dimethyl-1,3-diacetoxydisiloxane, 1,2-dimethyl-1,2-diacetoxydisilane, 1,3-dimethyl-1,3-dipropionoxydisilamethane, and 1,3-diethyl-1,3-diacetoxydisilamethane. Non-limiting examples of the aminosilane compound include N-(2-aminoethyl)aminopropyltri(methoxy)silane, N-(2-aminoethyl)aminopropyltri(ethoxy)silane, N-(2-aminoethyl)aminopropylmethyldi(methoxy)silane, N-(2-aminoethyl)aminopropylmethyldi(ethoxy)silane, 3-aminopropyl tri(methoxy)silane, 3-aminopropyltri(ethoxy)silane, 3-aminopropylmethyldi(methoxy)silane, and 3-aminopropylmethyldi(ethoxy)silane. Non-limiting examples of the mercaptosilane compound include mercaptopropyltrimethoxysilane, mercaptopropyltriethoxysilane, mercaptoethyltrimethoxysilane, and mercaptoethyltriethoxysilane.

The above-described silane compound may be applied to or deposited on the surface of the substrate 110 to form a functional group (a functional group resulting from a silane compound layer). The silane compound layer may be formed by applying and drying a silane compound solution. Alternatively, the silane compound may be deposited by supplying a gaseous silane compound to the substrate surface.

As the silane compound functional group will react with a metal precursor to be supplied later to fix metal ions to the substrate, it is preferred to form the silane compound layer as a uniform layer where the functional groups are uniformly exposed to the surface. The silane compound layer may be formed by atomic layer deposition (ALD).

The above-described silane compounds with functional groups (particularly the silane compound of Formulas 2, 3, and 4) may belong to the above-described self-assembly molecule group. Specifically, $(R^3)_3Si$ may correspond to the functional group 122 that is bonded to the substrate surface 114, $R^4$ may correspond to the chain group 124, and R (R in formula 2) such as —SH, —COOH or —$NH_2$ may correspond to the functional group 126 that bonds with metal ions 130. The silane compound layer may be a monomolecular layer (a layer which is substantially the same as one linker molecule or one silane molecule in thickness).

FIGS. 2B and 2C show metal ions 130 bonded to the linkers 120A. The metal ions 130 may be bonded to the functional groups 126 of the linkers 120A.

The metal ions 130 may be formed by supplying a metal precursor to the substrate (having the linkers formed thereon). Specifically, the metal ions 130 may be formed by applying (or impregnating) a metal precursor solution to the substrate or applying a gaseous metal precursor to the substrate.

The metal precursor may be designed in view of the material of the desired nanoparticles. For example, the metal precursor may be one or more metals selected from among transition metals, post-transition metals, and metalloids. In a non-limiting embodiment, the transition metal precursor may be a transition metal salt. Specifically, the transition metal may be one or more selected from among Au, Ag, Ru, Pd and Pt, and the transition metal salt may be selected from among halides, chalcogenides, hydrochlorides, nitrates, sulfates, acetates or ammonium salts of the transition metal. When the transition metal of the transition metal precursor is Au, examples of the transition metal precursor include, but are not limited to, $HAuCl_4$, $AuCl$, $AuCl_3$, $Au_4Cl_8$, $KAuCl_4$, $NaAuCl_4$, $NaAuBr_4$, $AuBr_3$, $AuBr$, $AuF_3$, $AuF_5$, $AuI$, $AuI_3$, $KAu(CN)_2$, $Au_2O_3$, $Au_2S$, $Au_2S_3$, $AuSe$, $Au_2Se_3$, and the like.

The metal ions 130 that are bonded (attached) to the substrate by the linkers 120A may be ions of one or more metals (elements) selected from among transition metals, post-transition metals, and metalloids. Depending on the kind of metal precursor, the metal ions 130 may be the above-described metal ions themselves or ions including the above-described metals (e.g. a compound ion). Metal ions themselves may be bonded to the functional groups 126 of the organic molecules (linkers) (see FIG. 2B), or metal-containing ions may be bonded to the second functional groups 126 of organic molecules (see FIG. 2C). Metal-containing ions may originate from a reaction between the metal precursor and the functional groups of the organic molecules (i.e. the linkers 120A).

FIG. 2D shows metallic nanoparticles 140 formed by the reduction and growth of the metal ions 130 by application of energy. The metallic nanoparticles 140 may be bonded to the substrate 110 by way of the linkers 120A.

Advanced technology enables the synthesis of very fine nanoparticles, but in view of thermodynamics, synthesized nanoparticles may not have a uniform particle size distribution and the difference in size between the nanoparticles may increase as the size of the reaction field during synthesis increases. In addition, a method of preparing nanoparticles by etching using a top-down process enables the preparation of particles having a size of 20 nm or less by advanced lithography, but it is difficult to apply commercially because the process is complicated and precise control is required.

However, in a preparation method according to an embodiment, nanoparticles are prepared directly in a very small reaction field corresponding to the surface region of the substrate, and thus nanoparticles having a very uniform and finely controlled size may be prepared at high density. Because nanoparticles are prepared by fixing metal ions to the substrate by the linkers and then applying energy to the metal ions, the nanoparticles may be quickly produced in a simple, easy and cost-effective manner. Further, because nucleation and growth (formation of nanoparticles) are induced by application of energy in a state where metal atoms (ions) are fixed to the substrate by the linkers, the migration of the metal atoms (ions) may be controlled resulting in the formation of more uniform and fine nanoparticles. The metal material to be used for nucleation and growth to form nanoparticles may be supplied solely by the metal atoms (ions) that are bonded to the linkers. In other words, the supply of material used to form nanoparticles comes from the diffusion of the metal atoms (ions) bonded to the linkers. Due to bonding of the metal atoms (ions) to the linkers, the metal atoms (ions) have difficulty in going beyond a predetermined distance to participate in nucleation and growth, and thus the reaction field of each nanoparticle may be limited to around the nucleus. Thus, nanoparticles having a more uniform and finer size may be formed on the substrate at high density and the separation distance between the formed nanoparticles may also be uniform. In addition, bonding of the metallic nanoparticles to the linkers is maintained, and thus the nanoparticles may be stably fixed to the substrate by the linkers. The separation distance between the nanoparticles may indicate how far the metal atoms are diffusing to participate in nucleation and growth.

Energy that is applied to form the nanoparticles may be one or more selected from among heat energy, chemical energy, light energy, vibration energy, ion beam energy, electron beam energy, and radiation energy.

Thermal energy may include Joule heat. Thermal energy may be applied directly or indirectly. Direct application of thermal energy may be performed in a state in which a heat source and a substrate having metal ions fixed thereto come into physical contact with each other. Indirect application of thermal energy may be performed in a state in which a heat source and a substrate having metal ions fixed thereto do not come into physical contact with each other. Non-limiting examples of direct application include a method of placing a heating element, which generates Joule heat by the flow of electric current, beneath the substrate and transferring thermal energy to the metal ions through the substrate. Non-limiting examples of indirect application include a method that uses a conventional heat-treatment furnace including a space in which an object (such as a tube) to be heat-treated is placed, a heat insulation material that surrounds the space to prevent heat loss, and a heating element placed inside the heat insulation material. A non-limiting example of indirect heat application is seen in the method of placing a heating element at a predetermined distance above the substrate, where the metal ions are fixed, and transferring thermal energy to the metal ions through a fluid (including air) present between the substrate and the heating element.

Light energy may include light having a wavelength ranging from extreme ultraviolet to near-infrared, and application of light energy may include irradiation with light. In a non-limiting embodiment, a light source may be placed above the substrate, having the metal ions fixed thereto, at a predetermined distance from the metal ions, and light from the light source may be irradiated onto the metal ions.

Vibration energy may include microwaves and/or ultrasonic waves. Application of vibration energy may include irradiation with microwaves and/or ultrasonic waves. In a non-limiting embodiment, a microwave and/or ultrasonic wave source may be placed above the substrate, having the metal ions fixed thereto, at a predetermined distance from the metal ions, and microwaves and/or ultrasonic waves from the source may be irradiated onto the metal ions.

Radiation energy may include one or more selected from among $\alpha$ rays, $\beta$ rays and $\gamma$ rays. In a non-limiting embodiment, a radiation source may be placed above the substrate, having the metal ions fixed thereto, at a predetermined distance from the metal ions and radiation from the source may be irradiated onto the metal ions.

Energy may be kinetic energy of a particle beam, and the particle beam may include an ion beam and/or an electron beam. The ions of the beam may be negatively charged. In a non-limiting embodiment, an ion or electron source may be placed above the substrate, having the metal ions fixed thereto, at a predetermined distance from the metal ions, and an ion beam and/or electron beam may be applied to the metal ions using an accelerating element that provides an electric field (magnetic field) that accelerates ions or electrons in the direction of the metal ions.

Chemical energy is the Gibbs free energy difference between before and after a chemical reaction, and the chemical energy may include reduction energy. Chemical energy may include the energy of a reduction reaction with a reducing agent and may mean the energy of a reduction reaction in which the metal ions are reduced by the reducing agent. In a non-limiting embodiment, application of chemical energy may be a reduction reaction in which the reducing agent is brought into contact with the substrate having the metal ions fixed thereto. The reducing agent may be supplied in the liquid or gaseous state.

In a fabrication method according to an embodiment, application of energy may include simultaneously or sequentially applying two or more selected from among heat energy, chemical energy, light energy, vibration energy, ion beam energy, electron beam energy, and radiation energy.

In a specific embodiment of simultaneous application, application of heat may be performed simultaneously with application of a particle beam. It is to be understood that the particles of the particle beam may be heated by heat energy. In another specific embodiment of simultaneous application, application of heat may be performed simultaneously with application of a reducing agent. In still another embodiment of simultaneous application, application of a particle beam may be performed simultaneously with application of infrared rays or with application of microwaves.

Sequential application may mean that one kind of energy is applied followed by application of another kind of energy. It may also mean that different kinds of energy are continuously or discontinuously applied to the metal ions. It is preferable that reduction of the metal ions fixed to the substrate by the linkers be performed before formation of nanoparticles, and thus, in a specific embodiment of sequential application, heat may be applied after addition of a reducing agent or after application of a positively charged particle beam. That is to say the metal ions 130 (which may be metal compound ions) should be reduced in a first step to form neutrally charged particles, followed by agglomeration of the neutrally charged particles to form the metallic nanoparticles 140.

In a non-limiting practical embodiment, application of energy may be performed using a rapid thermal processing (RTP) system including a tungsten-halogen lamp. The rapid thermal processing may be performed at a heating rate of 50 to 150° C./sec. Also, rapid thermal processing may be performed in a reducing atmosphere or an inert gas atmosphere.

In a non-limiting practical embodiment, application of energy may be performed by bringing a solution of a reducing agent in a solvent into contact with the metal ions followed by thermal processing using the rapid thermal processing system in a reducing atmosphere or an inert gas atmosphere.

In a non-limiting practical embodiment, application of energy may be performed by generating an electron beam from an electron beam generator in a vacuum chamber and accelerating the generated electron beam to the metal ions. The electron beam generator may be a square type or a linear gun type. The electron beam may be produced by generating plasma from the electron beam generator and extracting electrons from the plasma using a shielding membrane. In addition, a heating element may be provided on a holder for supporting the substrate in the vacuum chamber, and heat energy may be applied to the substrate by this heating element before, during and/or after application of the electron beam.

When the desired nanoparticles are metal nanoparticles, the metal nanoparticles may be prepared in situ by application of energy as described above. When the nanoparticles to be prepared are not metal nanoparticles, but are metal compound nanoparticles, the metal compound nanoparticles may be prepared by supplying a substance different from the metal ions before, during, or after application of the above-described energy. Specifically, the metal compound nanoparticles may include metal oxide nanoparticles, metal nitride nanoparticles, metal carbide nanoparticles or intermetallic compound nanoparticles. The metal compound nanoparticles may be prepared by supplying a different substance in the gaseous or liquid state before, during or after application of the above-described energy. In a specific embodiment, metal oxide nanoparticles in place of metal nanoparticles may be prepared by supplying an oxygen source such as oxygen gas during application of energy. In addition, metal nitride nanoparticles in place of metal nanoparticles may be prepared by supplying a nitrogen source such as nitrogen gas during application of energy. Metal carbide nanoparticles may be prepared by supplying a carbon source, such as $C_1$-$C_{10}$ hydrocarbon gas during application of energy, and intermetallic compound nanoparticles may be prepared by supplying a precursor gas containing a different substance that will react to form an intermetallic compound during application of energy. Specifically, the intermetallic compound nanoparticles may be prepared by carbonizing, oxidizing, nitrifying or alloying the metal nanoparticles prepared by application of the above-described energy.

The density of nanoparticles (the number of nanoparticles per unit surface area of the channel region) and the particle size and particle size distribution may be controlled by the energy application conditions, including the kind, magnitude, temperature, and duration of energy applied.

To be specific, nanoparticles having an average particle diameter of about 0.5 to 3 nm may be fabricated by applying energy. The method may produce highly uniform nanoparticles, with a particle radius standard deviation of about ±20% or less, and highly dense nanoparticles having a nanoparticle density (which is the number of the nanoparticles per unit area) of about $10^{13}$ to $10^{15}/cm^2$.

According to an embodiment, when the applied energy is an electron beam, the electron beam may be irradiated at a dose of about 0.1 KGy to 100 KGy. With this irradiation dose of an electron beam, nanoparticles having an average particle diameter of about 2 to 3 nm may be prepared, and the nanoparticles may have a particle radius standard deviation of about ±20% or less. The nanoparticle density (which is the number of the nanoparticles per unit area) may range from about $10^{13}$ to $10^{15}/cm^2$.

According to another embodiment, when the applied energy is an electron beam, the electron beam may be irradiated at a dose of about 100 µGy to 50 KGy. With this irradiation dose of an electron beam, nanoparticles having an average particle diameter of about 1.3 to 1.9 nm may be prepared, and the nanoparticles may have a particle radius standard deviation of about ±20% or less. The nanoparticle density (which is the number of the nanoparticles per unit area) may range from about $10^{13}$ to $10^{15}/cm^2$ and, specifically, the nanoparticle density may range from about $0.2 \times 10^{14}$ to $0.2 \times 10^{15}/cm^2$.

According to another embodiment, when the applied energy is an electron beam, the electron beam may be irradiated at a dose of about 1 µGy to 10 KGy. With this irradiation dose of an electron beam, nanoparticles having an average particle diameter of about 0.5 to 1.2 nm may be prepared, and the nanoparticles may have a particle radius standard deviation of about ±20% or less. The nanoparticle density (which is the number of the nanoparticles per unit area) may range from about $10^{13}$ to $10^{15}/cm^2$, and specifically, the nanoparticle density may range from about $0.2 > 10^{14}$ to $0.3 \times 10^{15}/cm^2$.

According to another embodiment, when the applied energy is heat energy, nanoparticles having an average particle diameter of about 2 to 3 nm may be prepared by performing a heat treatment in a reducing atmosphere at a temperature of about 100 to 500° C. for about 0.5 to 2 hours or by supplying a reducing agent to the metal ions bonded to the linkers and performing a heat treatment in an inert gas atmosphere at a temperature of about 200 to 400° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}/cm^2$.

According to another embodiment, when the applied energy is heat energy, nanoparticles having an average particle diameter of about 1.3 to 1.9 nm may be prepared by performing a heat treatment in a reducing atmosphere at a temperature of about 200 to 400° C. for about 0.5 to 2 hours or by supplying a reducing agent to the metal ions bonded to the linkers and performing a heat treatment in an inert gas atmosphere at a temperature of about 100 to 300° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}/cm^2$ and, specifically, the nanoparticle density may range from about $0.2 \times 10^{14}$ to $0.2 \times 10^{15}/cm^2$.

According to another embodiment, when the applied energy is heat energy, nanoparticles having an average particle diameter of about 0.5 to 1.2 nm may be prepared by performing a heat treatment in a reducing atmosphere at a temperature of about 200 to 400° C. for about 0.2 to 1 hour or by supplying a reducing agent to the metal ions bonded to the linkers and performing a heat treatment in an inert gas atmosphere at a temperature of about 100 to 300° C. for about 0.2 to 1 hour. The prepared nanoparticles may have a particle radius standard deviation of about ±20% or less. The nanoparticle density (which is the number of the nanoparticles per unit area) may range from about $10^{13}$ to $10^{15}/cm^2$ and, specifically, the nanoparticle density may range from about $0.2 \times 10^{14}$ to $0.3 \times 10^{15}/cm^2$.

According to another embodiment, when the applied energy is chemical energy, nanoparticles having an average particle diameter of about 2 to 3 nm may be prepared by performing a chemical reaction induced by a reducing agent at a reaction temperature of about 20 to 40° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}/cm^2$.

According to another embodiment, when the applied energy is chemical energy, nanoparticles having an average particle diameter of about 1.3 to 1.9 nm may be prepared by performing a chemical reaction induced by a reducing agent at a reaction temperature of about −25 to 5° C. for about 0.5 to 2 hours. The prepared nanoparticles may have a particle radius standard deviation of about ±20% or less. The nanoparticle density (which is the number of the nanoparticles per unit area) may range from about $10^{13}$ to $10^{15}/cm^2$ and, specifically, the nanoparticle density may range from about $0.2 \times 10^{14}$ to $0.2 \times 10^{15}/cm^2$.

According to another embodiment, when the applied energy is chemical energy, nanoparticles having an average particle diameter of about 0.5 to 1.2 nm may be prepared by performing a chemical reaction induced by a reducing agent at a reaction temperature of about −25 to 5° C. for about 0.2 to 1 hours. The prepared nanoparticles may have a particle radius standard deviation of about ±20% or less. The nanoparticle density (which is the number of the nanoparticles per unit area) may range from about $10^{13}$ to $10^{15}/cm^2$ and, specifically, the nanoparticle density may range from about $0.2 \times 10^{14}$ to $0.3 \times 10^{15}/cm^2$.

As described above, when heat energy is applied, there are three options: applying heat energy in a reducing atmosphere; sequentially applying chemical energy and heat energy; or only applying chemical energy with heat energy. When heat energy is applied in a reducing atmosphere, the reducing atmosphere may contain hydrogen. In a specific embodiment, the reducing atmosphere may be an inert gas containing about 1 to 5% of hydrogen. To provide uniform reduction, heat energy may be applied in an atmosphere in which a reducing gas flows. In a specific embodiment, the atmosphere may have reducing gas flowing at a flow rate of about 10 to 100 cc/min. When chemical energy and heat energy are to be sequentially applied, a reducing agent may be brought into contact with the metal ions bonded to the linkers, followed by application of heat energy in an inert atmosphere. The reducing agent may be any compound that reduces the metal ions into a metal. When chemical energy is applied by addition of the reducing agent, nanoparticles may also be formed by a reduction reaction. When nanoparticles are formed from the metal ions by a reduction reaction, the reduction reaction should occur very rapidly and uniformly throughout the channel region so that metal particles having a more uniform size may be formed. A strong reducing agent may be used, and in a preferred embodiment, the reducing agent may be $NaBH_4$, $KBH_4$, $N_2H_4H_2O$, $N_2H_4$, $LiAlH_4$, HCHO, $CH_3CHO$, or a mixture of two or more thereof. Also, when chemical energy is applied, the size and nucleation rate of the nanoparticles may be controlled by adjusting the chemical reaction temperature. The contact between the metal ions bonded to the linkers and the reducing agent may be achieved either by applying a solution of the reducing agent dissolved in a solvent to the metal ion bonded region, or by impregnating the substrate with a solution of the reducing agent dissolved in a solvent, or by supplying the reducing agent in a gaseous phase to the substrate. In a specific non-limiting embodiment, the contact between the reducing agent and the metal ions may be performed at room temperature for about 1 to 12 hours.

As described above, the nucleation and growth of transition metal nanoparticles may be controlled by one or more factors including the kind, magnitude, and duration of the applied energy.

It is also possible to prepare metal oxide nanoparticles, metal nitride nanoparticles, metal carbide nanoparticles, or intermetallic compound nanoparticles by supplying a heterogeneous atom source while energy is applied or after energy is applied to change metallic nanoparticles into metallic compound nanoparticles.

In a fabrication method according to an embodiment, the size of nanoparticles may be controlled by supplying an organic surfactant that bonds or adsorbs on the metal ions, followed by application of energy. Otherwise, the size of nanoparticles may be controlled by supplying an organic surfactant that bonds or adsorbs on the metal ions or the nanoparticles that are being grown during the application of energy. This supply of the organic surfactant may be optionally performed during the fabrication process. Instead of a single organic surfactant, multiple organic surfactants may be applied.

To more effectively inhibit the mass transfer of the metal ions, a first organic material and a second organic material of different types may be used.

The first organic material may be a nitrogen- or sulfur-containing organic compound. For example, the sulfur-containing organic material may include a linear or branched hydrocarbon compound having a thiol group at one end. In a specific example, the sulfur-containing organic compound may be one or more selected from among $HS-C_n-CH_3$ (n: an integer ranging from 2 to 20), n-dodecyl mercaptan, methyl mercaptan, ethyl mercaptan, butyl mercaptan, ethylhexyl mercaptan, isooctyl mercaptan, tert-dodecyl mercaptan, thioglycolacetic acid, mercaptopropionic acid, mercaptoethanol, mercaptopropanol, mercaptobutanol, mercaptohexanol and octyl thioglycolate.

The second organic material may be a phase-transfer catalyst-based organic compound, for example, quaternary ammonium or a phosphonium salt. More specifically, the second organic surfactant may be one or more selected from among tetraocylammonium bromide, tetraethylammonium, tetra-n-butylammonium bromide, tetramethylammonium chloride, and tetrabutylammonium fluoride.

The organic surfactant that is applied before or during application of energy may be bonded to or adsorbed on the nuclei of metal ions or the metal ions bonded to the linkers, and the nucleation and growth of nanoparticles by energy applied may be controlled by the organic surfactant that is bonded to or adsorbed on the metal ions. This organic surfactant makes it possible to inhibit the mass transfer of the metal ions (or neutrally charged metal particles, assuming the ions have already been reduced by the applied energy) during application of energy to thereby form more uniform and finer nanoparticles. Because the metal ions bond with the organic surfactant, these metal ions require higher activation energy compared to when they diffuse without surfactant to participate in nucleation or growth, or the diffusion thereof is physically inhibited by the organic surfactant. Thus, the diffusion of the metal particles (ions) may be slowed and the number of the metal particles (ions) that participate in the growth of nuclei may be decreased.

The process of applying energy in the presence of the organic surfactant may include, before application of energy, applying a solution of the organic surfactant to the channel region (i.e., the substrate surface having the metal ions bonded thereto by the linkers) or supplying the organic surfactant in the gaseous state to the channel region. Alternatively, it may include, together with application of energy, applying a solution of the organic surfactant to the channel region having the metal ions formed therein or supplying the organic material in the gaseous state to the channel region to bond or adsorb the organic surfactant to the metal nuclei. Alternatively, it may include, during application of energy, applying a solution of the organic surfactant to the channel region having the metal ions formed therein or supplying the organic material in the gaseous state to the channel region to bond or adsorb the organic surfactant to the metal nuclei. Alternatively, it may include, after application of energy for a predetermined period of time and while pausing energy application, applying a solution of the organic surfactant to the channel region having the metal ions formed therein or supplying the organic material in the gaseous state to the channel region to bond or adsorb the organic surfactant to the metal nuclei, followed by re-application of energy.

In a fabrication method according to an embodiment, energy may be applied to the entire area or a portion of the region having the metal ions bonded thereto. When energy is applied to a portion of the region, energy may be irradiated in a spot, line or predetermined plane shape. In a non-limiting embodiment, energy may be applied (irradiated) in spots while the entire metal ion-bonded region may be entirely scanned. Application of energy to a portion of the metal ion-bonded region may include not only irradiating energy in a spot, line or plane shape while the entire metal ion-bonded region is scanned, but also irradiating energy on only a portion of the metal ion-bonded region. As described above, a pattern of nanoparticles may be formed by applying energy to a portion of the channel region. In other words, application (irradiation) of energy to a portion of the channel region makes it possible to form a pattern of nanoparticles.

Figure 2E:
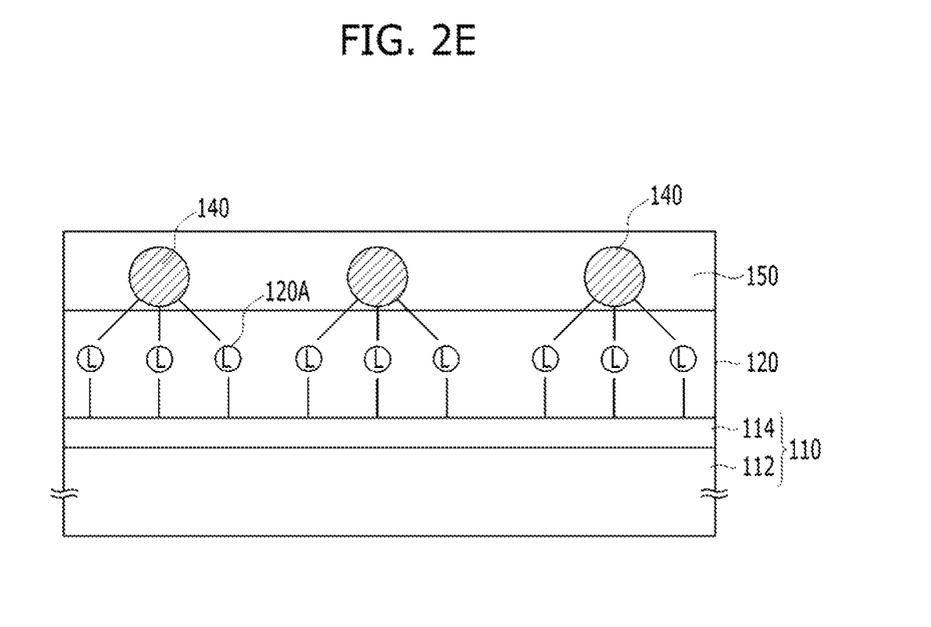

FIG. 2E shows a nitride 150 formed on the metallic nanoparticles 140 grown by application of energy. The nitride 150 may fill the gaps between the metallic nanoparticles 140.

As is well known, the nitride 150 has charge trapping sites. However, the charge trapping sites of the nitride 150 have a drawback in that the data retention time is not sufficiently long due to insufficient density and/or uniformity of the charge trapping sites. The charge trapping layer formed in accordance with the embodiment includes nanoparticles 140 and the nitride 150. Since the nanoparticles 140 have high uniformity, fine particle sizes, and high density, the nanoparticles 140 assist the nitride 150 in trapping charges.

If an organic surfactant is supplied before or during application of energy, it may remain on the surface of the grown nanoparticles. The remaining organic surfactant may be removed before the formation of the nitride 150. Even though a minute amount of organic surfactant remains, the nitride 150 may be directly formed without removing the remaining organic surfactant. Because whether the organic surfactant is used (or the amount and kind of the organic surfactant to be supplied) depends on desired size of nanoparticles 140 to be formed, the removing of the organic surfactant may not be necessary. In other words, no organic surfactant or only a small amount of organic surfactant may used, making its removal unnecessary.

Referring to FIG. 2E, the structure of the improved charge trapping layer formed through the fabrication method in accordance with the first embodiment is described in detail.

Referring to FIG. 2E, the improved charge trapping layer may include linkers 120A formed over a substrate 110, and metallic nanoparticles 140 that are grown from metal ions 130 bonded to the linkers 120A. Also, the charge trapping layer may further include a nitride 150 covering and filling the gaps between the metallic nanoparticles 140.

The substrate 110 may include a surface layer 114 having functional groups capable of bonding to the linkers 120A. The surface layer 114 may include an oxide that functions as a tunneling layer.

The substrate 110 may be a flexible substrate, which may include a surface layer having hydroxyl (—OH) functional groups. The flexible substrate may include one or a mixture of two or more selected from polyethylene terephthalate (PET), polyethylene naphthalate (PEN), polyimide (PT), polycarbonate (PC), polypropylene (PP), triacetyl cellulose (TAC), polyethersulfone (PES), and polydimethylsiloxane (PDMS).

The linkers 120A may be organic molecules bonded to the surface of the substrate 110 through self-assembly. The charge trapping layer may include a linker layer 120 formed of linkers 120A bonded to the surface of the substrate 110. The linker layer 120 may be a self-assembled monomolecular layer on the surface of the substrate 110. Also, the linker layer 120 may be a silane compound layer having one functional group selected from an amine group, a carboxylic acid group, and a thiol group. The linkers 120A may include one functional group selected from an amine group, a carboxylic acid group, and a thiol group. Each of the linkers 120A may include a first functional group (which is denoted by 122 in FIG. 2A) bonded to the surface of the substrate 110, a second functional group (which is denoted by 126 in FIG. 1B) bonded to metal ions 130, and a chain group (which is denoted by 124 in FIG. 2A) for connecting the first functional group and the second functional group to each other.

The metallic nanoparticles 140 may be selected from metal nanoparticles, metal oxide nanoparticles, metal nitride nanoparticles, metal carbide nanoparticles, and intermetallic compound nanoparticles. The metallic nanoparticles 140 are formed by bonding metal ions 130 to the linkers 120A, reducing the metal ions 130 into neutrally charged metal particles, and then agglomerating the neutrally charged metal particles to form the metallic nanoparticles. The reduction and agglomeration may be performed using energy as described above, including the use of heat energy.

The size of the metallic nanoparticles 140 may be controlled according to the energy application conditions. Also, the size of nanoparticles may be controlled before the energy for growing the metallic nanoparticles 140 is applied or while applying the energy by whether a surfactant is supplied. The surfactant may be an organic surfactant, and the surfactant may remain on the surface of the metallic nanoparticles 140 after the growing of the metallic nanoparticles 140 is finished. According to an embodiment, when no surfactant is used, the metallic nanoparticles 140 may have a particle diameter of about 2.0 to 3.0 nm. According to another embodiment, when a single kind of surfactant is used, the metallic nanoparticles 140 may have a particle diameter of about 1.3 to 1.6 nm. According to another embodiment, when multiple kinds of surfactants are used, the metallic nanoparticles 140 may have an average particle diameter of about 0.5 to 1.2 nm.

The metallic nanoparticles that are arranged to be separated from each other on the same plane may form a single nanoparticle layer (a layer one nanoparticle thick). This is because, as described above, the nanoparticle layer is formed by applying energy to a layer of metal ions formed over a substrate and bonded by linkers.

According to another embodiment, the nanoparticles of the nanoparticle layer may have an average particle diameter of about 0.5 to 3 nm with a particle radius standard deviation of about ±20% or less, which means that the nanoparticles have very uniform particle sizes, and a nanoparticle density (which is the number of the nanoparticles per unit area) of about $10^{13}$ to $10^{15}/cm^2$.

The gaps between the grown metallic nanoparticles 140 may be filled with the nitride 150. The nanoparticles 140 may be buried in the nitride 150. Also, the organic surfactant may remain on the surface of the nanoparticles 140.

The charge trapping layer in accordance with the first embodiment may have a vertical multi-stack structure. In other words, the metallic nanoparticles 140 may be arranged separately from each other over the linker layer 120 to form a nanoparticle layer, and the charge trapping layer may have a stacked structure where the linker layer 120 and the nanoparticle layer are stacked alternately and repeatedly.

[Improved Charge Trapping Layer and Method for Forming the Same in Accordance with a Second Embodiment of the Present Invention]

FIGS. 3A to 3D are cross-sectional views describing a method for forming an improved charge trapping layer in accordance with a second embodiment.

Figure 3A:
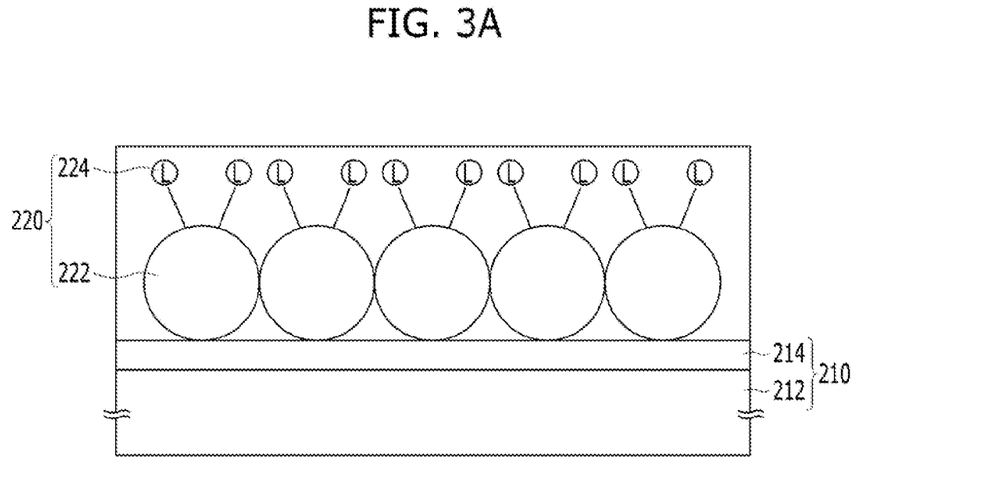
FIGS. 3A to 3D are cross-sectional views describing a method for forming a charge trapping layer in accordance with a second embodiment of the present disclosure.
Figure 3B:
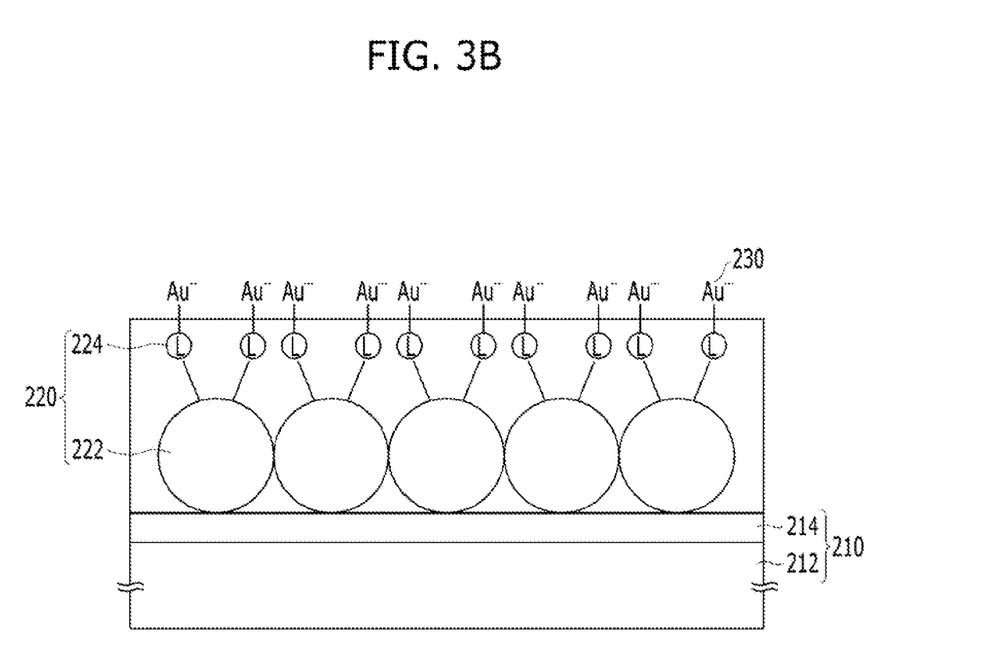
Figure 3C:
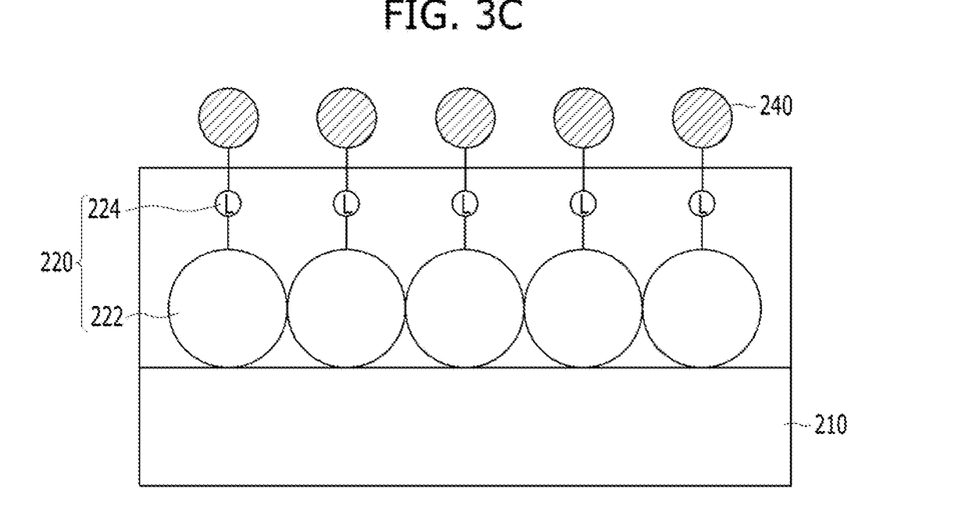

The method for fabricating the charge trapping layer in accordance with the second embodiment may include forming dielectric particle supporters 222 where linkers 224 are bonded over a substrate 210 (refer to FIG. 3A), bonding metal ions 230 to the linkers 224 (refer to FIG. 3B), and forming the metal ions 230 into metallic nanoparticles 240 by applying energy to the metallic nanoparticles 240 (refer to FIG. 3C). The method may further include supplying a nitride 250 to the structure where the metallic nanoparticles 240 are formed (refer to FIG. 3D). Also, the method may further include supplying one or more organic surfactants before the energy is applied or while applying the energy.

FIG. 3A shows the substrate 210 where the dielectric particle supporters 222 are bonded with linkers 224 over the substrate 210. The dielectric particle supporters 222 may be formed in plural, and each of the dielectric particle supporters 222 may include the linkers 224 attached thereto. The substrate 210 may include a silicon substrate 212 and a surface layer 214 formed over the silicon substrate 212. The surface layer 214 may be a silicon oxide layer that functions as a tunneling layer.

The substrate 210 may be a flexible substrate or a transparent substrate. When a flexible substrate 210 is used, the surface layer 214 of the substrate 210 may be an organic material having hydroxyl (—OH) functional groups.

In the second embodiment, the substrate 210 may have the materials and structures described in the first embodiment.

The dielectric particle supporters 222 and the linkers 224 may be combined to form a supporter layer 220.

Forming the supporter layer 220 may include preparing a supporter layer material by mixing a dielectric material and linkers in a solvent, and depositing the supporter layer material on the substrate 210. The supporter layer material may be spin-coated on the substrate 210 or a liquid deposition method of immersing the substrate 210 in a solution where the supporter layer material is dissolved may be used.

The dielectric particle supporters 222 may include an oxide having at least one element selected from metals, transition metals, post-transition metals, and metalloids. Also, the dielectric particle supporters 222 may include at least one material selected from among a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, a hafnium silicate and polymers.

The linkers 120A may be organic molecules that are suitable for being chemically bonded to or adsorbed on the surface of the dielectric particle supporters 222 and of being chemically bonded to the metal ions 230. To be specific, the linkers 224 may be organic molecules that include first functional groups suitable for bonding to or adsorbing on the surface of the dielectric particle supporters 222 and second functional groups suitable for chemically bonding to metal ions 230, which are to be formed subsequently. The linkers 224 may also include chain groups for connecting the first functional groups and the second functional groups to each other. The linkers 224 may include a functional group suitable for being bonded to metal ions 230 which is selected from among an amine group, a carboxylic acid group, and a thiol group. As for the linkers 224, the examples listed previously may be applied here.

FIG. 3B shows metal ions 230 bonded to the linkers 224. The metal ions 230 may be bonded to the functional groups of the linkers 224. The metal ions 230 may be formed by supplying a metal precursor to the substrate (having the linkers formed thereon). Specifically, the metal ions 230 may be formed by applying a metal precursor solution to the substrate 210 or applying a gaseous metal precursor to the substrate 210. The method for bonding the metal ions 230 to the linkers 224 and the materials include those described above in the first embodiment.

FIG. 3C shows metallic nanoparticles 240 formed by applying energy and growing the metal ions 230. The energy that is applied to form the nanoparticles may be one or more selected from among heat energy, chemical energy, light energy, vibration energy, ion beam energy, electron beam energy, and radiation energy. The methods for applying energy include the same methods described above in the first embodiment.

In a fabrication method according to a second embodiment, the size of nanoparticles may be controlled by supplying an organic surfactant that is to be bonded to or adsorbed on the metal ions, followed by application of energy. Otherwise, the size of nanoparticles may be controlled during the growth thereof by supplying an organic surfactant that is to be bonded to or adsorbed on the metal ions during application of energy. This supply of the organic surfactant may be optionally performed during the fabrication process. Instead of a single organic surfactant being applied, two or more different kinds may be applied.

To more effectively inhibit the transfer of the metal ions, a first organic material and a second organic material of different kinds may be used.

The first organic material may be a nitrogen- or sulfur-containing organic compound. For example, the sulfur-containing organic material may include a linear or branched hydrocarbon compound having a thiol group at one end. In a specific example, the sulfur-containing organic compound may be one or more selected from among HS—$C_n$—$CH_3$ (n: an integer ranging from 2 to 20), n-dodecyl mercaptan, methyl mercaptan, ethyl mercaptan, butyl mercaptan, ethylhexyl mercaptan, isooctyl mercaptan, tert-dodecyl mercaptan, thioglycolacetic acid, mercaptopropionic acid, mercaptoethanol, mercaptopropanol, mercaptobutanol, mercaptohexanol and octyl thioglycolate.

The second organic material may be a phase-transfer catalyst-based organic compound, for example, a quaternary ammonium or a phosphonium salt. More specifically, the second organic surfactant may be one or more selected from among tetraocylammonium bromide, tetraethylammonium, tetra-n-butylammonium bromide, tetramethylammonium chloride, and tetrabutylammonium fluoride.

The organic surfactant that is supplied before or during the application of the energy may be bonded to or adsorbed on the nuclei of the metal ions or the metal ions bonded to the linkers, and the nucleation and growth of nanoparticles by the applied energy may be controlled by the organic surfactant that is bonded to or adsorbed on the metal ions. In other words, it is possible to form fine and uniform metallic nanoparticles 240.

Figure 3D:
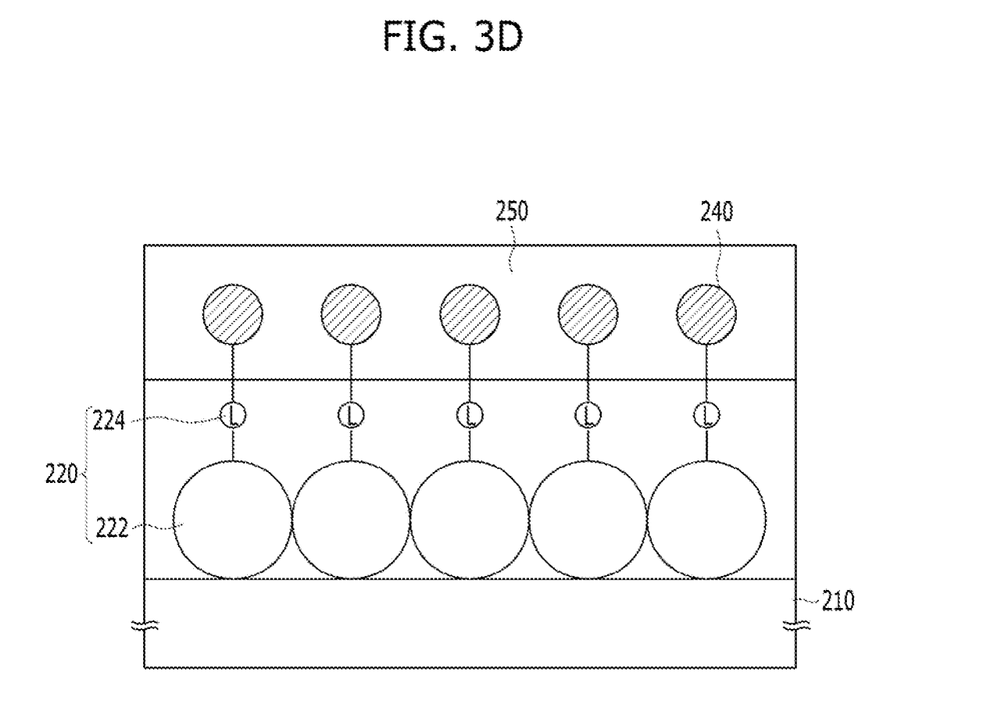

FIG. 3D shows a nitride 250 formed over the resultant structure where the metallic nanoparticles 240 are formed. The nitride 250 may fill the gaps between and cover the metallic nanoparticles 240.

The metallic nanoparticles 240 may be buried in the nitride 250. Also, the organic surfactant may remain on the surface of the grown metallic nanoparticles 240.

Referring to FIG. 3D, the improved charge trapping layer formed through the fabrication method in accordance with the second embodiment is described in detail.

Referring to FIG. 3D, the improved charge trapping layer may include dielectric particle supporters 222, where the linkers 224 are bonded, formed over a substrate 210, and metallic nanoparticles 240 that are grown from metal ions 230 bonded to the linkers 224. Also, the charge trapping layer may further include a nitride 250 filling the gaps between and covering the metallic nanoparticles 240.

The substrate 210 may include a surface layer 214, e.g., a tunneling layer. The surface layer 214 may include an oxide layer. To be specific, non-limiting examples of the surface layer of the substrate 210 include a layer of at least one material selected from a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, and a hafnium silicate.

The substrate 210 may be a flexible substrate, which may include a surface layer 214 having hydroxyl (—OH) functional groups. The flexible substrate may include one or a mixture of two or more selected from polyethylene terephthalate (PET), polyethylene naphthalate (PEN), polyimide (PI), polycarbonate (PC), polypropylene (PP), triacetyl cellulose (TAC), polyethersulfone (PES), and polydimethylsiloxane (PDMS).

The dielectric particle supporters 222 may be oxide particles having at least one element selected from metals, transition metals, post-transition metals, and metalloids. The dielectric particle supporters 222 may be particles having an average particle diameter of about 10 to 20 nm. The dielectric particle supporters 222 may form a single layer (one dielectric particle thick) or multiple layers (multiple dielectric particles thick) over the substrate 210.

Also, the dielectric particle supporters 222 may include at least one material selected from a silicon oxide, a hafnium oxide, an aluminum oxide, a zirconium oxide, a barium-titanium composite oxide, an yttrium oxide, a tungsten oxide, a tantalum oxide, a zinc oxide, a titanium oxide, a tin oxide, a barium-zirconium composite oxide, a silicon nitride, a silicon oxynitride, a zirconium silicate, a hafnium silicate and polymers.

The linkers 224 may be organic molecules. The charge trapping layer may include a linker layer having the linkers 224 bonded to the surface of the substrate 210. The linker layer may be a self-assembled monomolecular layer where organic molecules are arranged. Also, each of the linkers 224 may include a functional group selected from an amine group, a carboxylic acid group, and a thiol group. Each of the linkers 120A may include a first functional group bonded to the surface of the dielectric particle supporters 222, a second functional group bonded to metal ions 230, and a chain group for connecting the first functional group and the second functional group to each other.

The metallic nanoparticles 240 may be selected from metal nanoparticles, metal oxide nanoparticles, metal nitride nanoparticles, metal carbide nanoparticles, and intermetallic compound nanoparticles. The metallic nanoparticles 240 are grown by bonding metal ions 230 to the linkers 224 and then growing (i.e. reducing and agglomerating) the metal ions. However, the metal ions 230 may be reduced first to form neutrally charged nanoparticles, followed by agglomeration using heat or another method to form the metallic nanoparticles 240.

The size of the metallic nanoparticles 240 may be controlled according to the energy application conditions while the metallic nanoparticles 240 are grown. Also, the size of nanoparticles may be controlled before the energy for growing 21 the metallic nanoparticles 240 is applied or during energy application by whether a surfactant is supplied or not. The surfactant may be an organic surfactant, and the surfactant may remain on the surface of the metallic nanoparticles 240 after the growing of the metallic nanoparticles 240 is finished. According to an embodiment, when no surfactant is used, the metallic nanoparticles 240 may have an average particle diameter of about 2.0 to 3.0 nm. According to another embodiment, when a single kind of surfactant is used, the metallic nanoparticles 240 may have an average particle diameter of about 1.3 to 1.6 nm. According to another embodiment, when multiple surfactants are used, the metallic nanoparticles 240 may have an average particle diameter of about 0.5 to 1.2 nm. Examples of metallic nanoparticles 240 in this embodiment can be seen in the examples given above in the previously described embodiment.

The nitride 250 may be formed over a resultant structure where the metallic nanoparticles 240 are formed. The nitride 250 may fill the gaps between the metallic nanoparticles 240 that are arranged to be separated from each other.

The improved charge trapping layer in accordance with the second embodiment may have a vertical multi-stack structure. In other words, the nano structure may have a stacked structure where the supporter layer 220, including the linkers 224 and the dielectric particle supporters 222, and the nanoparticle layer are stacked alternately and repeatedly.

According to the embodiments, since the charge-trapping memory device includes a charge trapping layer that is formed of high-density nanoparticles that are extremely fine and have uniform particle size, the charge-trapping memory device may be scaled down to reduce power consumption. Also, even when scaled down, the charge-trapping memory device has excellent operation stability, reproducibility, and reliability. Also, since the nanoparticles are fixed with insulating linkers, the nanoparticles have excellent physical stability and prevent stored charges from being lost, even when a tunneling layer is damaged.

According to the embodiments, the nanoparticles of a charge trapping layer are directly formed through a simple process of forming a metal ion layer by using linkers and applying energy to the metal ion layer. Because of this process, it is possible to form a charge trapping layer of extremely fine, uniformly sized, high-density nanoparticles. Also, as the nanoparticles of the charge trapping layer are formed in-situ, wasteful consumption of a raw material may be minimized.

Although various embodiments have been described for illustrative purposes, it will be apparent to those skilled in the art that various changes and modifications may be made without departing from the spirit and scope of the disclosure as defined in the following claims.

What is claimed is:

1. A method for fabricating a non-volatile memory device, comprising:
    forming a tunneling layer over a substrate; and
    forming a charge trapping layer over the tunneling layer, wherein the forming of the charge trapping layer comprises:
        forming a linker layer, which includes linkers, over the tunneling layer;
        forming metal ions over the linker layer;
        forming metallic nanoparticles by growing from the metal ions; and
        forming a nitride over the metallic nanoparticles,
    wherein the metallic nanoparticles are formed through reduction and growth of the metal ions being formed over the linker layer prior to forming the metallic nanoparticles.

2. The method of claim 1, wherein the forming of the metallic nanoparticles comprises:
    applying energy to the metal ions.

3. The method of claim 2, further comprising:
    supplying an organic surfactant of one or more kinds, before or during the application of energy.

4. The method of claim 3, further comprising:
removing the organic surfactant that remains on the metallic nanoparticles, before the forming of the nitride.

5. The method of claim 2, wherein the energy is at least one selected from heat energy, chemical energy, light energy, vibration energy, ion beam energy, electron beam energy, and radiation energy.

6. The method of claim 1, wherein the linker layer is formed by applying a linker solution to a surface of the substrate.

7. The method of claim 1, wherein the linker layer is formed through an Atomic Layer Deposition (ALD) process using a gas containing the linkers.

8. The method of claim 1, wherein the linker layer comprises a functional group selected from an amine group ($-NH_2$), a carboxyl group ($-COOH$), and a thiol group ($-SH$).

9. The method of claim 1, wherein the forming of the metal ions comprises:
applying a metal precursor to the linkers.

10. The method of claim 1, wherein the forming of the metal ions comprises:
applying a metal precursor solution, in which a metal precursor is dissolved, to the linkers, or supplying a gas-phase metal precursor to the linkers.

11. A method for fabricating a non-volatile memory device, comprising:
forming a tunneling layer over a substrate; and
forming a charge trapping layer over the tunneling layer,
wherein the forming of the charge trapping layer comprises:
forming dielectric particle supporters over the tunneling layer;
forming linkers over the dielectric particle supporters;
bonding metal ions to the linkers;
forming metallic nanoparticles by growing from the metal ions; and
forming a nitride over the metallic nanoparticles,
wherein the metallic nanoparticles are formed through reduction and growth of the metal ions being formed over the linkers prior to forming the metallic nanoparticles.

12. The method of claim 11, wherein the forming of the dielectric particle supporters and the linkers comprises:
preparing a supporter material by mixing dielectric material particles and linkers to form a solution; and
coating the substrate with the supporter material or depositing the supporter material on the substrate.

13. The method of claim 11, wherein the forming of the metallic nanoparticles comprises:
applying energy to the metal ions.

14. The method of claim 13, further comprising:
supplying an organic surfactant of one or more kinds, before or during the application of energy.

15. The method of claim 14, further comprising:
removing the organic surfactant that remains on the metallic nanoparticles, before the forming of the nitride.

16. The method of claim 13, wherein the energy is at least one selected from heat energy, chemical energy, light energy, vibration energy, ion beam energy, electron beam energy, and radiation energy.

17. The method of claim 11, wherein each of the linkers comprises a functional group selected from an amine group ($-NH_2$), a carboxyl group ($-COOH$), and a thiol group ($-SH$) that is suitable for bonding to the metal ions.

18. The method of claim 11, wherein the forming of the metal ions comprises:
applying a metal precursor to the linkers.

19. The method of claim 11, wherein the forming of the metal ions comprises:
applying a metal precursor solution where a metal precursor is dissolved to the linkers, or supplying a gas-phase metal precursor the linkers.

* * * * *